United States Patent

Wensink et al.

[15] 3,666,995

[45] May 30, 1972

[54] INTEGRATED SEMICONDUCTOR DEVICE

[72] Inventors: Bernardus Leonardus Wensink; Adriaan Cense, both of Nijmegen, Netherlands

[73] Assignee: U.S. Philips Corporation, New York, N.Y.

[22] Filed: Apr. 28, 1970

[21] Appl. No.: 32,694

[30] Foreign Application Priority Data

May 10, 1969 Netherlands..........................6907227

[52] U.S. Cl. ..........................................317/101 A, 317/235

[51] Int. Cl. ........................................................H01l 19/00

[58] Field of Search .......................317/101 A, 235; 29/610; 338/288, 289, 295

[56] References Cited

UNITED STATES PATENTS

| | | | |
|---|---|---|---|
| 3,468,728 | 9/1969 | Martin | 317/235 D |
| 3,500,140 | 3/1970 | Makimoto et al. | 317/235 D |

*Primary Examiner*—David Smith, Jr.

*Attorney*—Frank R. Trifari

[57] ABSTRACT

In an integrated semiconductor device according to the invention, a resistance element with small resistance comprises between its electric connections a number of parallel arranged resistance zones of the same width and thickness. The influence of inaccuracies in providing the electric connections is eliminated, and a zone of a resistance element with large resistor may have the same width and thickness as the parallel zones of the resistance element with small resistance.

4 Claims, 4 Drawing Figures

Figure 1:
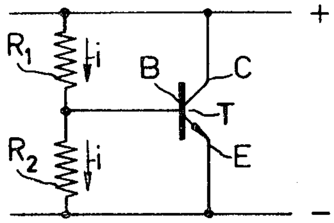

INVENTORS
BERNARDUS L. WENSINK
ADRIAAN CENSE
BY
AGENT

INTEGRATED SEMICONDUCTOR DEVICE

The invention relates to an integrated semiconductor device comprising a number of semiconductor circuit elements, for example, transistors, diodes, resistors and capacities, in which at least one circuit element is a resistance element comprising a zone provided in a semiconductor body, said zone having two electric connections.

The semiconductor zone of a resistance element usually is a surface zone of a semiconductor body which is separated from the surrounding semiconductor material by a p-n junction. The zone of the resistance element, however, may also be situated at least partly below a further surface zone. In addition it is possible that the zone of the resistance element has a higher doping than, but the same conductivity type as, the surrounding semiconductor material.

The electric connections may be of metal and be connected to the zone via apertures in an insulating layer provided on a surface of the semiconductor body. However, an electric connection can also be formed by a zone adjoining the zone of the resistance element in the semiconductor body, for example, by the base zone of a transistor.

An integrated semiconductor device must often be provided with at least two resistance elements with considerably different resistances in which in particular the ratio of said resistances is important while their absolute value is not very critical.

When for the resistance element with large resistance an elongated zone is used in a conventional manner and for the resistance element with small resistance a zone is used, which, transverse to a direction between its electric connections, has the same width as the said elongated zone, the distance between the electric connections of the resistance element with small resistance often becomes very short, when the length of the elongated zone is limited to a practicable extent. Unavoidable inaccuracies in providing the electric connections then have an undesirably large influence on said small resistance and this means an undesirable inaccuracy in the said ratio of the resistances.

This inaccuracy can be avoided by making the zone of the resistance element with small resistance longer, that is to say, by increasing the distance between the electric connections and by also increasing the width of said zone.

However, the invention is based on the recognition of the fact that the desired reproducible accuracy in the ratio of the resistances is not obtained by this measure, since the difference in width of the zones of the resistance elements often causes an inaccuracy in said ratio, and the resistance element with small resistance must have a structure in which the zone of said element can have the same width as the zone of a resistance element with a considerably larger resistance, while avoiding an impracticably large length of the latter zone and an impracticably short distance between the electric connections of the resistance element with small resistance.

It is the object of the invention to provide such a structure.

According to the invention, an integrated semiconductor device comprising a number of semiconductor circuit elements, such as transistors, diodes, resistors and capacities, in which at least one circuit element is a resistance element comprising a zone provided in a semiconductor body, said zone having two electric connections, is characterized in that the resistance element between the electric connections comprises at least two separated, juxtaposed, elongated zones of the same width and thickness.

For simplicity, said elongated zones preferably also have the same length.

So the resistance element according to the invention comprises a number of parallel arranged zones. As a result of this, said zones can be longer and narrower than the zone of the corresponding resistance element having a conventional structure. The influence of inaccuracies in providing the electric connections can be eliminated thereby, while the width of said zones can, without any objection, be equal to that of a zone of a resistance element having a much higher resistance.

The elongated zones may be connected together by the electric connections only. Preferably, however, the elongated zones extend between two common parts of said zones, said common parts being provided with the electric connections. Then the zone of the resistance element has more or less the shape of a ladder. This preferred embodiment enables a low contact resistance between the electric connections and the ladder-shaped zone since the electric connections can be connected to the said common parts over a large area.

Since, as is obvious from the above, the invention is of particular importance for integrated semiconductor devices having at least two resistance elements in which the resistances differ considerably, a preferred embodiment of the integrated semiconductor device according to the invention is characterized in that the semiconductor device comprises at least one further resistance element having a zone which is provided with two electric connections, the zone between said electric connections comprising an elongated part which is longer than the said juxtaposed elongated zones and has the same width and thickness as said juxtaposed elongated zones.

Figure 2:
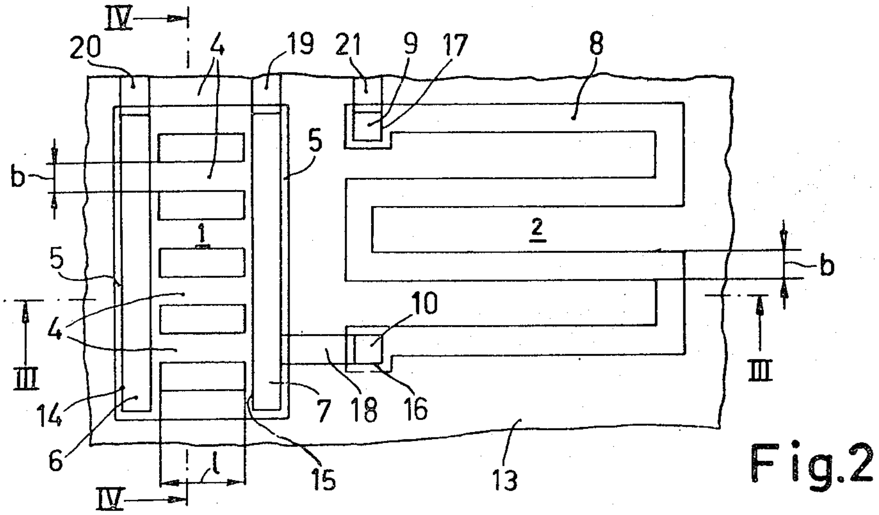
Figure 3:
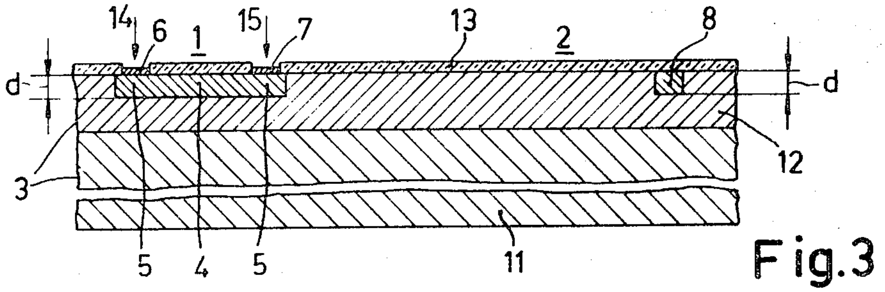
Figure 4:
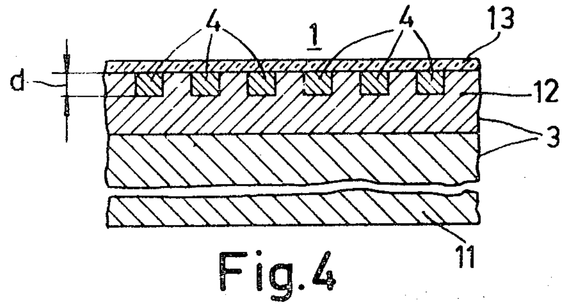

In order that the invention may be readily carried into effect, one embodiment thereof will now be described in greater detail, by way of example, with reference to the accompanying diagrammatic drawing, in which:

FIG. 1 is an example of a part of a circuit arrangement for which the invention is of importance, FIG. 2 is a plan view of a part of an embodiment of an integrated semiconductor device according to the invention comprising resistance elements with the resistors $R_1$ and $R_2$ of the circuit arrangement shown in FIG. 1, FIG. 3 is a cross-sectional view taken on the line III—III of FIG. 2, and FIG. 4 is a cross-sectional view taken on the line IV—IV of FIG. 2 of the said embodiment.

FIG. 1 shows only that part of a circuit arrangement which is interesting for the invention. The collector C of an n-p-n transistor T has a positive potential relative to the emitter E. The resistor $R_1$ is connected between the base B and the collector C and the resistor $R_2$ is connected between the base B and the emitter E of the transistor T. The resistors $R_1$ and $R_2$ serve as a voltage divider to obtain a constant voltage $V_{CE}$ between the collector C and the emitter E. This can be explained as follows:

The base current of a good transistor is very small. As a result of this, substantially the same current flows through the resistors $R_1$ and $R_2$ and thus the voltage $V_{CE}$ between the collector C and the emitter E equals $i\,R_1 + i\,R_2$. The emitter E is biased in the forward direction relative to the base B, in which the emitter base voltage $V_{EB}$ can be considered to be substantially constant. In conventional types of n-p-n silicon transistors, $V_{EB}$ is approximately 0.6 volt. So $i\,R_2 = 0.6$ volt or $i = 0.6$ volt/$R_2$. This means that $V_{CE} = (R_1/R_2 + 1)\ 0.6$ volt. If, for example, it is desirable to have a constant $V_{CE} = 60$ volt, $R_1$ must be equal to 99 $R_2$. The ratio between the resistors $R_1$ and $R_2$ hence is very important while their absolute value is slightly less important.

When the circuit arrangement shown in FIG. 1 is constructed as an integrated semiconductor device, it is often desirable for practical reasons that $R_2$ should be equal to at least 100 ohm. When $R_2$ is 100 ohm, $R_1$ must be 9,900 ohm.

Conventional integrated semiconductor devices usually comprise resistance elements having a diffused surface zone with a sheet resistance of approximately 200 ohm per square and a width (viewed transverse to the direction of flow in the zone between its electric connections) of approximately 15 $\mu$. The zone for the resistor $R_1$ must then have a length of $(9{,}900/200) \times 15\ \mu \approx 743\ \mu$ between its electric connections and the zone for the resistor $R_2$ must have a length of 7.5 $\mu$.

The length of 7.5$\mu$ is so short that unavoidable inaccuracies in providing the electric connections have a disturbing influence on the resistor $R_2$ and hence on the ratio between the resistors $R_1$ and $R_2$.

The zone for the resistor $R_2$ can be made longer and wider and thereby the said disturbing influence can be eliminated. The difference in width of the zones for the resistors $R_1$ and $R_2$, however, is found in practice to introduce inaccuracies in the ratio between the resistors also.

When the zone for the resistor $R_1$ is also made wider, said zone must also be made longer so that said zone obtains an impractically large length.

FIGS. 2 to 4 show the part of an embodiment which is of importance for the invention of an integrated semiconductor device according to the invention, which semiconductor device comprises a number of circuit elements such as transistors, diodes, resistors and capacities. The resistance element 1 comprises a zone 4,5 provided with two electric connections 6 and 7 present on the semiconductor body 3. According to the invention, the resistance element 1, corresponding to $R_2$ comprises between the electric connections 6 and 7 a number of separated, juxtaposed, elongated zones 4 of the same width *b* and thickness *d*. In the present embodiment the zones 4 also have the same length. By using the zones 4 connected in parallel between the electric connections 6 and 7, the difficulties described are avoided.

In order to obtain the said resistor $R_2$, the zones 4 which are 15 $\mu$ wide and have a sheet resistance of 200 ohm per square, must have a length of $6 \times 7.5\ \mu = 45\ \mu$, since six zones 4 are present, and this length is sufficient to prevent inaccuracies in providing the electric connections 6 and 7 from having a disturbing influence on the resistance of the resistance element 1.

In order to obtain the larger resistor $R_1$, a further resistance element 2 is present having a conventional structure. The resistance element 2 comprises a zone 8, likewise of a sheet resistance of 200 ohm per square, provided with two electric connections 9 and 10. Between the electric connections 9 and 10, the zone 8 comprises an elongated part which is longer than the elongated zones 4 and which has the same width *b* and thickness *d* as the zones 4. The length of the zone 8 between the connections 9 and 10 is approximately 743 $\mu$.

The zones 4 of the resistance element 1 can be electrically interconnected only by the electric connections 6 and 7. In the present embodiment, however, the elongated zones 4 extend between two common parts 5 of said zones 4 and the common parts 5 are provided with the electric connections 6 and 7. As a result of this, the connections 6 and 7 can be connected to the zone 4,5 over a large surface area, so that a low contact resistance is obtained between the connections 6 and 7 and the zone 4,5. The common parts 5 (as viewed in FIG. 2) have approximate dimensions of $22 \times 165\ \mu$.

The semiconductor body 3 conventionally consists of a p-type silicon substrate 11 having a thickness of approximately 200 $\mu$ and a resistivity of approximately 5 ohm.cm, provided with an n-type epitaxial silicon layer 12 having a thickness of approximately 10 $\mu$ and a resistivity of approximately 30 ohm.cm. The zones 4,5 and 8 are p-type surface zones which have been obtained in a conventional manner by diffusion of an impurity, such as boron, in the epitaxial layer 12 and which have a sheet resistance of approximately 200 ohm per square and a thickness of approximately 3 $\mu$. An insulating layer 13 of silicon oxide is provided in a conventional manner on the epitaxial layer 12. The electric connections 6, 7, 9 and 10 are situated in apertures 14, 15, 16 and 17 of the insulating layer 13 and consist, for example, of aluminum.

In order to obtain the circuit arrangement shown in FIG. 1, the electric connections 7 and 10 are interconnected by a conductive track 18 situated on the insulating layer 13 and are connected to the base of the transistor T (see FIG. 1) by the conductive track 19 situated on the insulating layer 13. Transistor T may have a conventional structure and since this is of little interest for the invention, the transistor T is not shown in FIGS. 2 to 4. The connection 6 is connected, via the conductive track 20, to the emitter and the connection 9 is connected, via the conductive track 21, to the collector of the transistor T.

It will be obvious that the invention is not restricted to the example described and that many variations are possible to those skilled in the art without departing from the scope of this invention. For example, the resistance element 1 may comprise more or fewer than six zones 4 and the resistance element may be incorporated in a circuit arrangement other than that described. The resistance elements 1 and 2, for example, can be used only as a voltage divider. The metal electric connections 6 and 7 of the resistance element are not always necessary. If the resistance element is to be connected, for example, to a zone of a further circuit element and said zone has the same conductivity type as the zone 4,5, the zone of the further circuit element may adjoin a part 5 of the zone 4,5, no metal connection being necessary between said zones. The zone of the further circuit element then forms an electric connection of the resistance element 1. For example, the electric connection 10 and the conductor 18 may be omitted if the zone 8 adjoins, with one end, a part 5 of the zone 4,5. The semiconductor body 3 may consist of a semiconductor material other than silicon, for example, of germanium or a III–V compound. Instead of silicon oxide, the insulating layer 3 may be, for example, silicon nitride or aluminum oxide. The said conductivity types n and p can be replaced by the conductivity types p and n, respectively. The zones 4 and 8 may be covered for the greater part by a surface zone of the same conductivity type as the epitaxial layer 12, as a result of which the zones 4 and 8 are buried zones, at least for the greater part.

What is claimed is:

1. An integrated semiconductor device comprising a semiconductor body portion having plural circuit elements including a first resistance element, said first resistance element comprising a pair of spaced common zones and extending in spaced parallel fashion between the common zones at least two separated, juxtaposed, elongated zones of substantially the same width, thickness and length between the common zones all within the semiconductor body portion, and two electric connections each to one of the common zones thereby electrically connecting the elongated zones in parallel with one another.

2. An integrated semiconductor device as set forth in claim 1 wherein the body portion is of one conductivity type, and the elongated zones and the common zones are of the opposite conductivity type.

3. An integrated semiconductor device as set forth in claim 1 and including a second resistance element, said second resistance element comprising within the semiconductor body portion an elongated zone having the same width and thickness but being longer than the elongated zones of the first resistance element, and electrical connections to the ends of the elongated zone of the second resistance element.

4. An integrated semiconductor device as set forth in claim 3 wherein the elongated zones of both resistance elements have the same sheet resistance but the total resistance of the second resistance element is larger than that of the first resistance element, and means are provided interconnecting an electric connection of the first resistance element with an electric connection of the second resistance element to thereby form a voltage divider.

* * * * *